United States Patent [19]
Fusayasu et al.

[11] Patent Number: 5,773,879
[45] Date of Patent: Jun. 30, 1998

[54] CU/MO/CU CLAD MOUNTING FOR HIGH FREQUENCY DEVICES

[75] Inventors: Tosihiro Fusayasu; Kenji Kagata; Hirotugu Yamada; Isao Kitamura; Masanobu Kohara; Mitsuyuki Takada, all of Amagasaki, Japan

[73] Assignee: Mitsubishi Denki Kabushiki Kaisha, Tokyo, Japan

[21] Appl. No.: 15,007

[22] Filed: Feb. 9, 1993

[30] Foreign Application Priority Data

Feb. 13, 1992 [JP] Japan ................................. 4-026368
Jan. 22, 1993 [JP] Japan ................................. 5-009106

[51] Int. Cl.$^6$ .......................... H01L 23/02; H01L 23/12; H01L 23/10; H01L 23/06
[52] U.S. Cl. .......................... 257/678; 257/704; 257/706; 257/710; 257/729
[58] Field of Search .................................... 257/678, 704, 257/680, 706, 710, 711, 794, 703, 708, 729

[56] References Cited

U.S. PATENT DOCUMENTS

| | | | |
|---|---|---|---|
| 3,337,678 | 8/1967 | Stelmak | 174/52 |
| 3,340,602 | 9/1967 | Hontz | 29/588 |
| 3,538,597 | 11/1970 | Leinkram et al. | 29/588 |
| 3,628,105 | 12/1971 | Sakai et al. | 317/234 R |
| 3,768,991 | 10/1973 | Rogers | 65/36 |
| 3,831,066 | 8/1974 | Gabaak | 317/234 R |
| 4,025,997 | 5/1977 | Gernitis et al. | 428/621 |
| 4,135,038 | 1/1979 | Takami et al. | 428/427 |
| 4,833,102 | 5/1989 | Brnye et al. | 437/218 |
| 4,989,070 | 1/1991 | Iversen et al. | 357/82 |
| 5,015,803 | 5/1991 | Mahulikar et al. | 257/703 |
| 5,023,398 | 6/1991 | Mahulikar et al. | 257/708 |

FOREIGN PATENT DOCUMENTS

| | | | |
|---|---|---|---|
| 54-129880 | 8/1979 | Japan | 257/710 |
| 60-7751 | 1/1985 | Japan | 257/710 |
| 62-274752 | 11/1987 | Japan | 257/704 |
| 01273337 | 11/1989 | Japan | 257/729 |

OTHER PUBLICATIONS

The Glass Industry, Electrical Properties and Uses of Glass, by R.G. Snell, pp. 484–521, Sep. 1962.

Primary Examiner—T. M. Arroyo
Attorney, Agent, or Firm—McDermott, Will & Emery

[57] ABSTRACT

The semiconductor package and manufacturing method thereof whereby the inexpensive package of high thermal conductivity is obtained by applying a Cu/Mo/Cu clad material for a base plate which matches the thermal expansion of a semiconductor chip, and the inexpensive package with high heat transfer suitable for a high frequency device is obtained by controlling a thickness of glass, and a size of a lead (width, thickness), thereby to match impedance of a wiring portion with that of the semiconductor chip, by plating only necessary areas with Au, and by plating the exterior with Sn.

1 Claim, 10 Drawing Sheets

//CU/MO/CU CLAD MOUNTING FOR HIGH FREQUENCY DEVICES

BACKGROUND OF THE INVENTION

1. Field of the Invention

This invention relates to a CER-DIP type semiconductor package having a leadframe welded by glass to a base plate to which a semiconductor chip is to be attached, and a manufacturing method thereof.

2. Description of the Related Art

Generally, in a semiconductor package of the type referred to above, as shown in FIG. 1, a leadframe 2 is welded to an alumina ceramic base plate 1 with use of low melting point glass 3, and after a semiconductor chip 4 is attached to the base plate 1 and subjected to wire bonding, an alumina ceramic cap 5 is welded by the glass 3. The semiconductor package is hermetically sealed in the above manner.

In the meantime, for improving heat transfer in the semiconductor package, a Cu clad material and an iron family metal, or a brazed material has been used for the base material (as disclosed in Japanese Patent Application Laid-Open No. 3-8362(1991)). There have been also revealed a a three-layered clad material capable of manufacturing by simpler method among the clad materials, which is an Invar/Cu/Invar sandwiching Cu to which an Invar (Fe—Ni alloy) of the small thermal expansion coefficient is applied (Japanese Application Laid-Open No. 2-303053 (1990)), or a clad material using a powder sintered material mainly composed of W or Mo and containing Fe, Ni and Cu (Japanese Patent Application Laid-Open No. 58-67049 (1983)).

Moreover, such a semiconductor package for high frequency devices requiring high heat transfer has been proposed, as shown in FIG. 2, of a Cu—W alloy base plate 6 with a leadframe 2 brazed to an alumina ceramic frame 7 on which formed a W-metallized wired layer. A semiconductor device is soldered and sealed with a cap 8 generally made of KOVAR (Fe—Ni—Co) after attaching the semiconductor chip 4 to the package and wire bonding the chip.

In the semiconductor package of a type wherein the base plate 6 and the frame 7 are brazed, the solder sometimes flows to the chip attaching face of the base plate during the brazing, thereby causing the chip to be inadequately attached. For solving the drawback, as illustrated in FIG. 3, a base plate 9 is processed to form a step between the chip attaching face and the brazing face.

In accordance with the recent spread of data communication equipments using high frequency GaAs devices, etc., an inexpensive semiconductor package with high heat transfer and suitable for the high frequency devices has been increasingly demanded.

Although the above-described CER-DIP package of the alumina ceramic base plate as shown in FIG. 1 is inexpensive, since the semiconductor packages necessitates higher heat transfer than that of alumina ceramics and the characteristic impedance of the lead portion is not controlled, the package does not suit for the high frequency devices. Further, sealing temperature required for sealing with glass is too high for GaAs devices.

In the meantime, the Cu—W alloy base plate in FIG. 2 is disadvantageously heavy for the requirement of the light-weight electronic devices. Moreover, the package becomes expensive because the material of the base plate is expensive, processing to form the step or grinding costs high, and the package is necessitated to be plated by Au in all through the manufacturing processes.

SUMMARY OF THE INVENTION

This invention has been devised to solve the above-described disadvantages, and has for its object to provide a semiconductor package which is light-weight, inexpensive, with high heat transfer and suitable for high frequency devices, and a manufacturing method thereof.

The above and further objects and features of the invention will more fully be apparent from the following detailed description with accompanying drawings.

DESCRIPTION OF THE PREFERRED EMBODIMENTS

Figure 1:
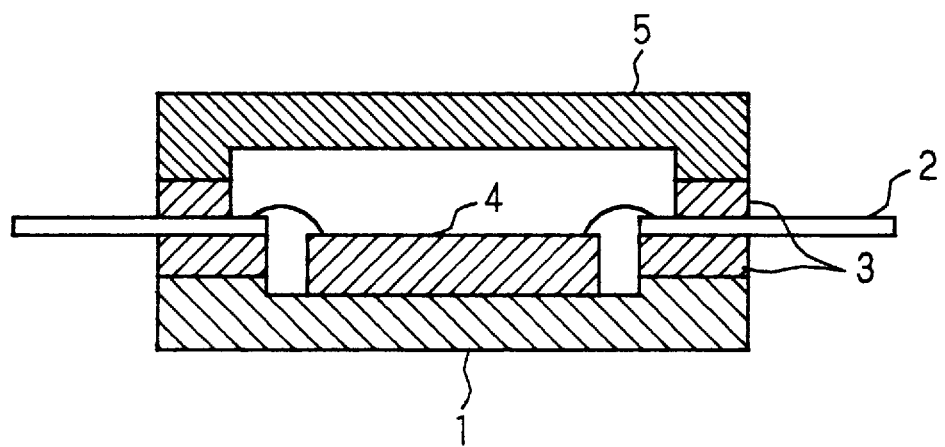
FIG. 1 is a side sectional view of a conventional semiconductor package.
Figure 2:
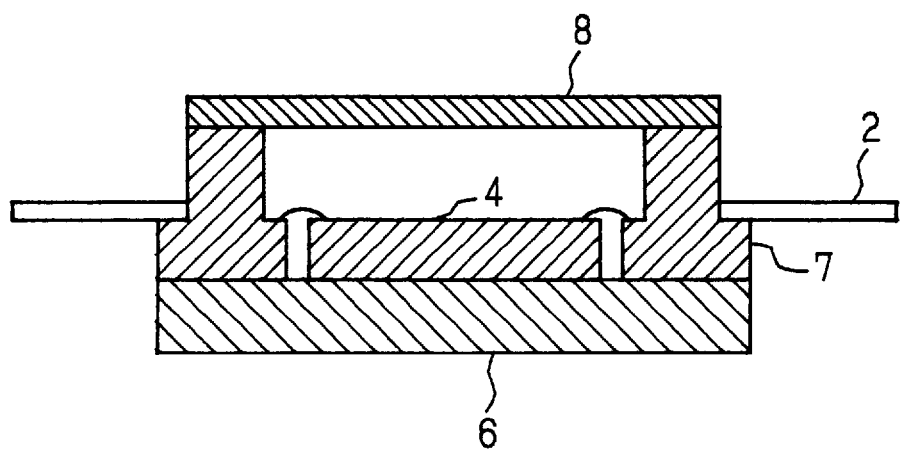
FIG. 2 is a side sectional view of another conventional semiconductor package.
Figure 3:
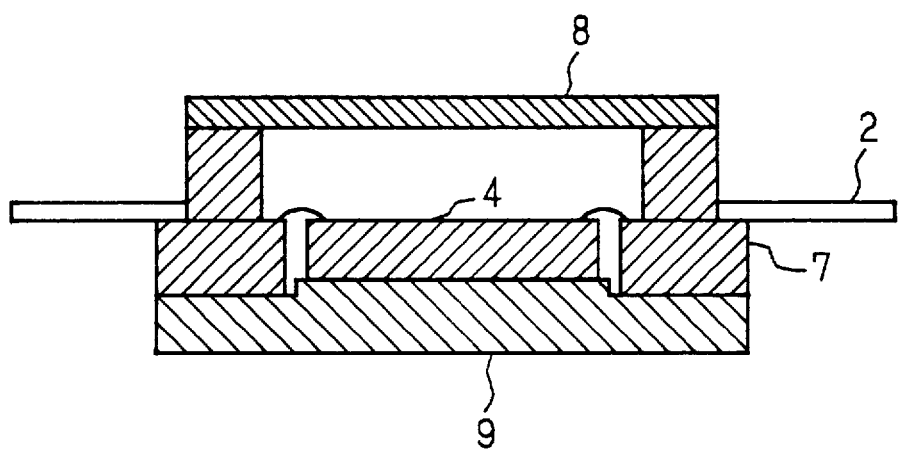
FIG. 3 is a side sectional view of a further conventional semiconductor package.
Figure 4A:
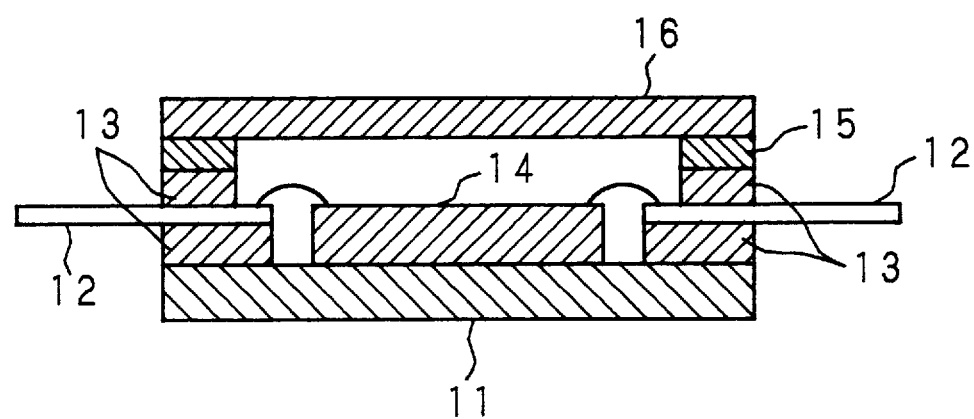
Figure 4B:
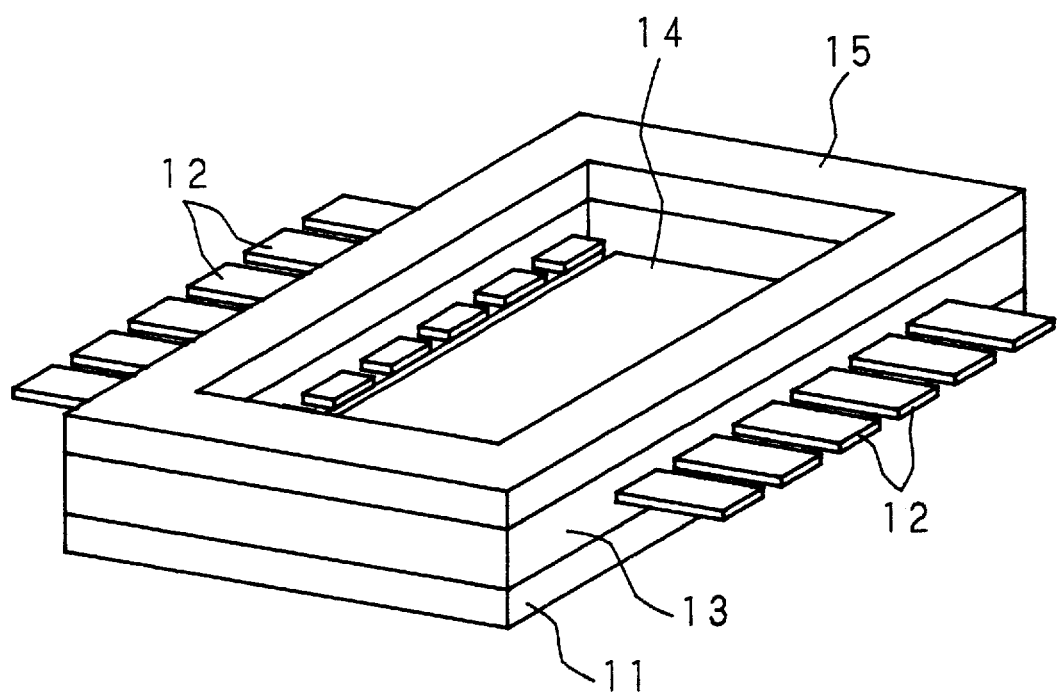
Figure 5A:
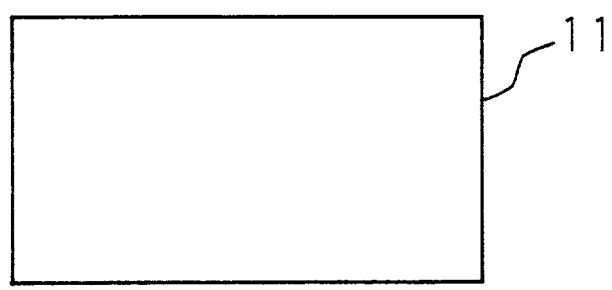
Figure 5B:
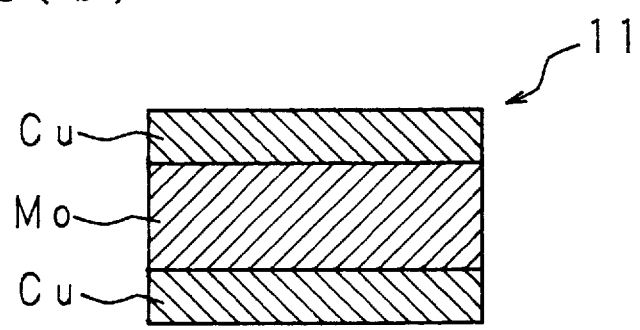
Figure 6A:
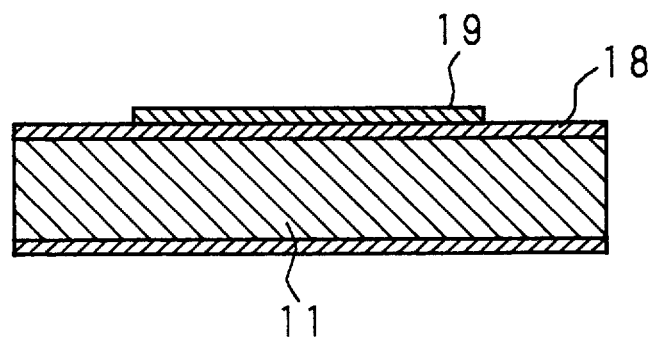
Figure 6B:
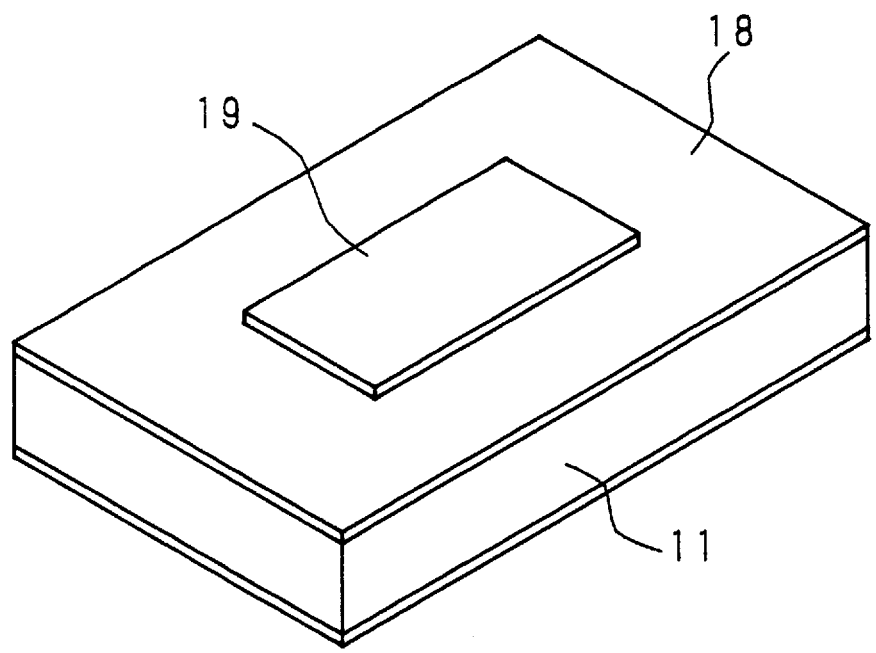
Figure 7A:
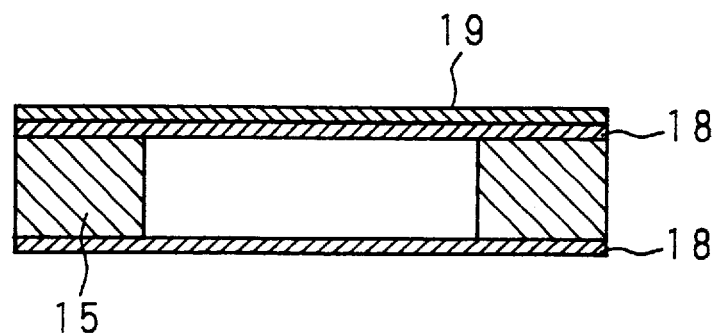
Figure 7B:
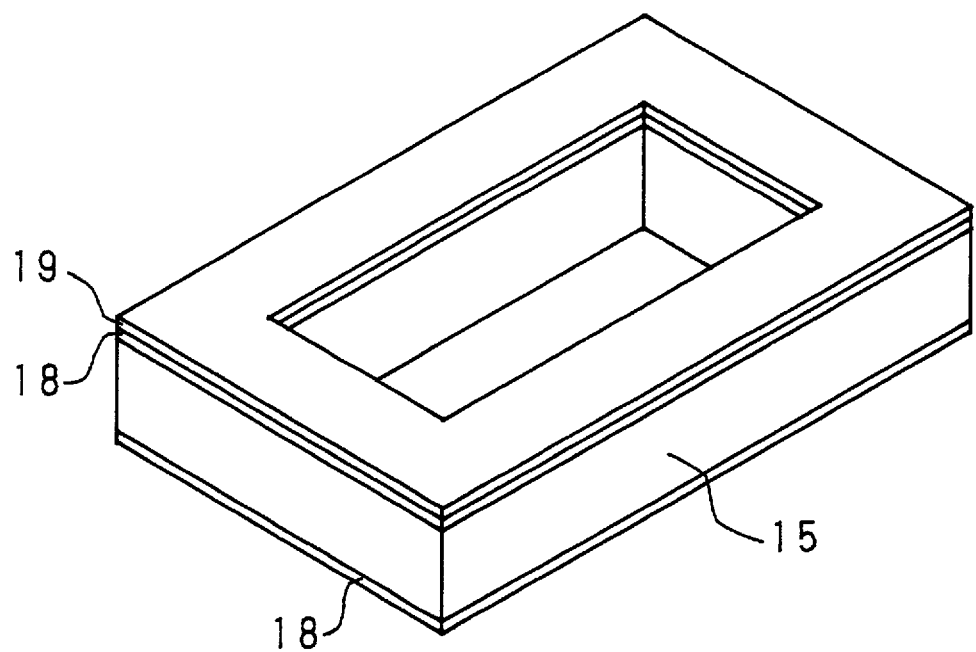
Figure 8:
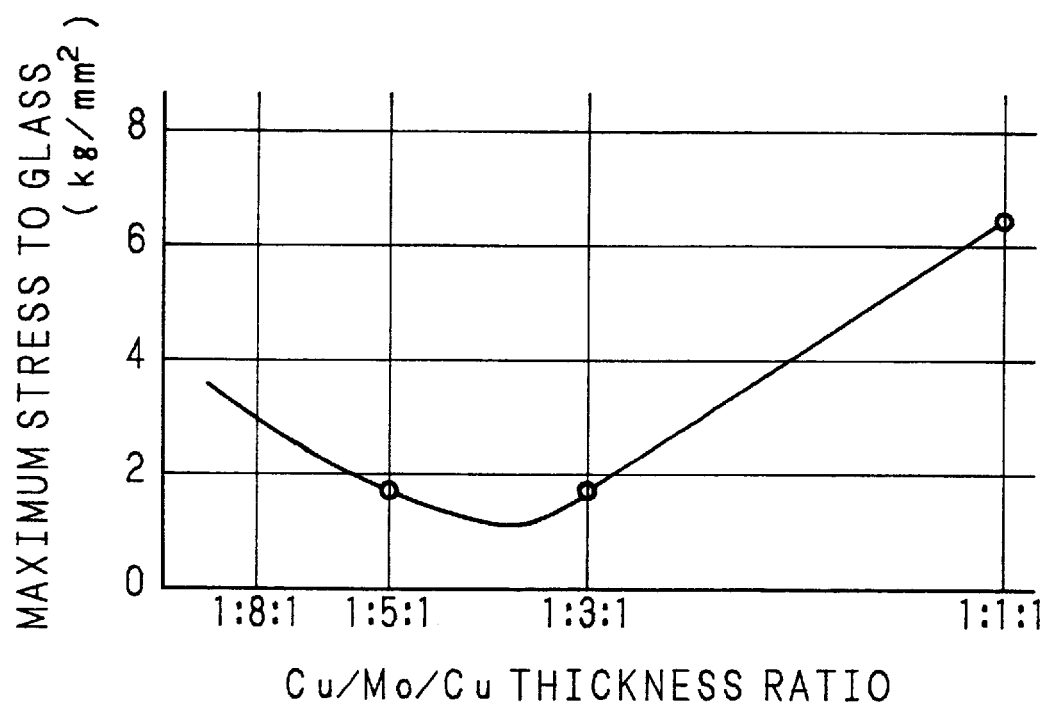
Figure 9A:
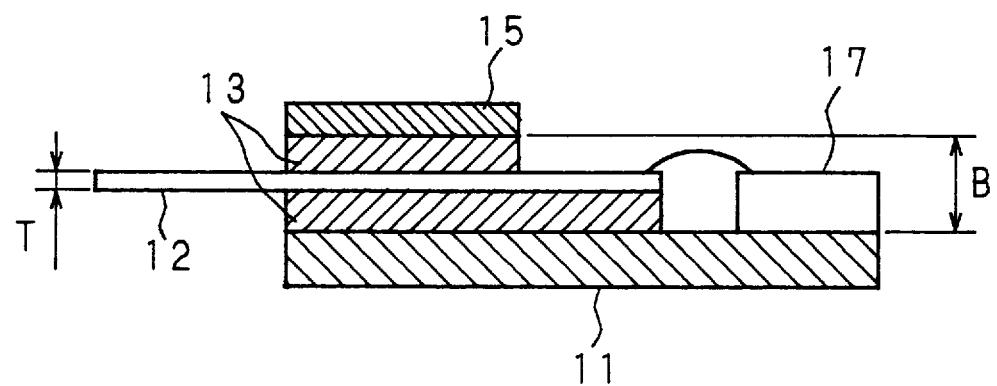
Figure 9B:
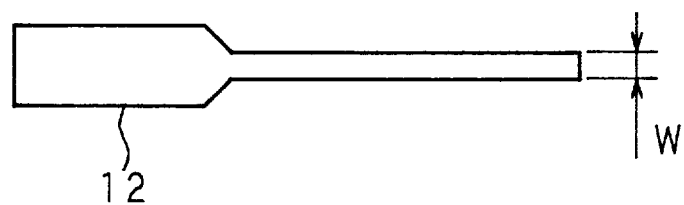
Figure 10:
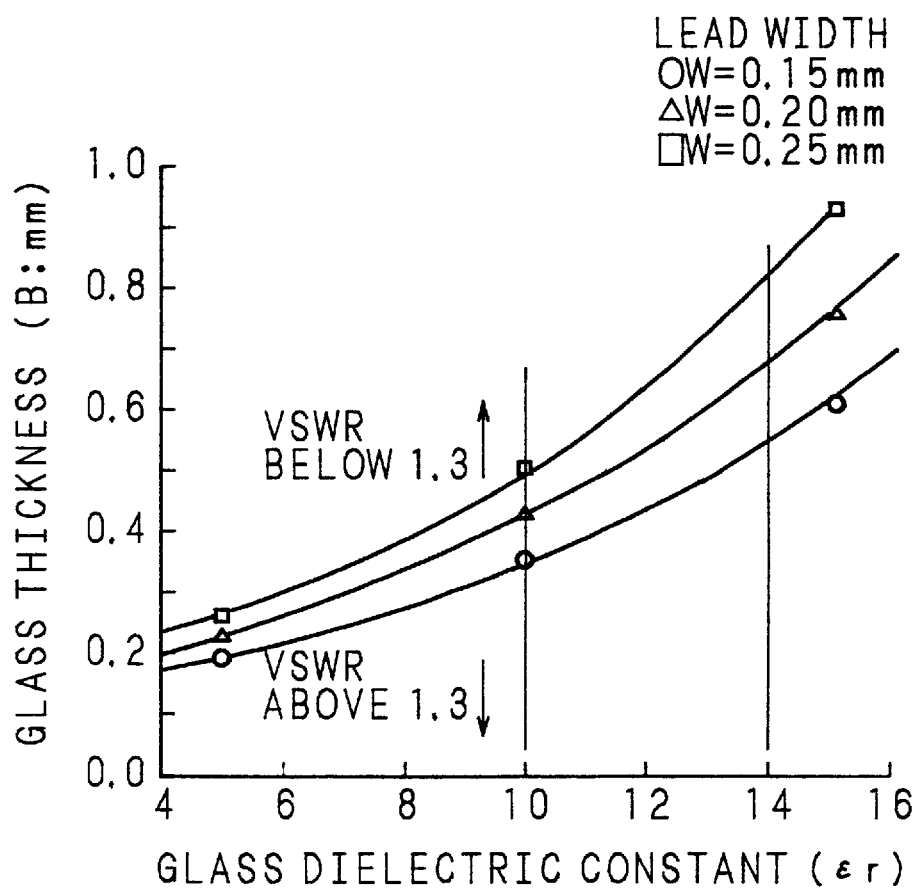

FIGS. 4(a)–(b) are a side sectional view of a semiconductor package of the invention arid a perspective view of the package without a cap;

FIGS. 5(a)–(b) are a plan view and a side sectional view of a base plate of the semiconductor package of the invention;

FIGS. 6(a)–(b) are a side sectional view and a perspective view of the base plate of the semiconductor package according to the invention explanatory of the plating process thereof;

FIGS. 7(a)–(b) are a side sectional view and a perspective view of a window frame of the semiconductor package according to the invention explanatory of the plating process thereof;

FIG. 8 is a graph showing the relationship between a thickness ratio of Cu/Mo/Cu layers of the package according to the invention and the maximum stress to glass;

FIGS. 9(a)–(b) are a side sectional view of a main part of another semiconductor package of the invention and a plan view of a lead; and FIG. 10 is a graph showing the relationship of glass thickness-dielectric constant-lead width in the package of the invention to obtain VSWR of 1.3.

DESCRIPTION OF THE PREFERRED EMBODIMENTS

Preferred embodiments of this invention will be discussed hereinafter with reference to the accompanying drawings. FIG. 4 shows a semiconductor package of this invention, where (a) is a side sectional view and (b) is a perspective view without a cap. FIG. 5 shows a base plate, where (a) is a plan view and (b) is a side sectional view. FIG. 6 shows a side sectional view (a) and a perspective view (b) explanatory of a manufacturing method. FIG. 7 shows a window frame explanatory of manufacturing method, where (a) is a side sectional view and (b) is a perspective view.

In the figures, a numeral 11 denotes a base plate which is formed of a three-layered Cu/Mo/Cu clad material.

In order to plate the base plate 11, if the base plate 11 is small in dimension as in this invention, the base plate is plated by barrel method after being processed to a predetermined size. However, since the barrel method is impossible to achieve fine plating, rack plating is performed in the embodiment. Meanwhile, the rack plating requires to provide electrodes, which worsens the workability if conducting rack plating after the base plate being processed to a predetermined size. Accordingly, in the instant embodiment, the base plate material before being processed to a predetermined size is plated with Ni 18 all over. Subsequently, the base plate is punched to a predetermined size as shown in FIG. 5. At this time, although the ends of the punched base plate 11 are naked, the exterior will be plated with Sn as will be described later, thereby a metallic layer is formed on the naked ends and thus bringing about no such problem as corrosion or the like. After the base plate is plated with Ni 18, it is masked except the chip attaching portion and the chip attaching portion is plated with Au 19.

A window frame 15 formed of Fe-45Ni is processed in the same manner as the aforementioned base plate 11 because of the same reason. More specifically, the window frame material is first plated with Ni 18 all over the surface, and then plated with Au only at the upper surface where a cap 16 is to be bonded, as shown in FIG. 7. A portion where a glass 13 is to be bonded is not plated with Au 19. Thereafter, a window frame of a predetermined size is punched out from the material. The ends of the window frame are naked alike. The window frame 15 may be made of ceramics, and if the window frame 15 is made of ceramics, metal powders of tungsten or molybdenum, etc. are printed on the surface of the ceramics which is not yet baked, and simultaneously baked with the ceramics and metallized. Accordingly, the wettability for the soldering is secured.

The cap 16 is a plate of Fe-45Ni (NS-5). A leadframe 12 made of Fe-45Ni is plated with Au only at a wire bonding spot thereof to be electrically connected to a semiconductor chip 14. The intervals between the base plate 11 and leadframe 12 and between the leadframe 12 and window frame 15 are welded by the low melting point glass 13.

After sealing the package, the exterior is plated with Sn. In comparison with the case where the exterior plating is performed before the sealing, the temperature influence or the like to the mounted semiconductor device becomes negligible, thereby increasing the degree of freedom to select the kind of plating although it is conventionally limited to Au plating.

Only areas, an area of the base plate 11 where the chip is to be attached, a wire bonding area of the leadframe 12 and a bonding area of the window frame 15 with the cap, are plated with Au, but an area of the base plate 11 to be bonded with the glass 13 is not plated with Au which is poor in wettability with glass or an adhesive. Therefore, the base plate 11 can be bonded to the glass or adhesive with improved adhering force, thus enhancing the reliability.

In the semiconductor package of the above structure, by using the low melting point glass 13 having the thermal expansion coefficient of $7.1 \times 10^{-6}/°C$., and window frame 15 and leadframe 12 of Fe-45Ni, supposing that the window frame 15 being 0.5 mm thick, leadframe 12 being 0.125 mm thick and base plate 11 being 0.5 mm thick, temperature cycle tests are conducted in -65° C./175° C.×20 cycles while the thickens ratio of Cu/Mo/Cu is changed, thereby to evaluate the air-tightness.

When the thickness ratio is 1:1:1, almost all of the packages are inadequate in leak. However, when the thickness ratio is 1:3:1–1:5:1, leak never occurs. The reason for this is supposed to be that, as shown in FIG. 8, the thermal stress to the glass is restricted to not larger than 2 kg/mm$^2$ when the thickness ratio is from 1:3:1 to 1:5:1, thereby preventing the glass 13 from leak.

Further, the warping after soldering and sealing of the package is measured by using the semiconductor package of the Cu/Mo/Cu base plate of the thickness ratio 1:5:1, and an Fe-45Ni (NS-5) plate of 0.125 mm thick or a KOVAR (Fe—Ni—Co) plate of the same thickness as the cap 16. When the Fe-45Ni plate is used, the semiconductor package does not warp. To the contrary, when the KOVAR (Fe—Ni—Co) plate is used, the semiconductor package warps 10 $\mu$m/14 mm. Accordingly, if the Fe—45Ni plate is used for the cap, it becomes possible to prevent the warping of the semiconductor package by sealing, and the reliability of the package is improved.

If the thermal expansion coefficients of components of the package, namely, cap 16, window frame 15, leadframe 12 and glass 13 are adjusted, the debonding of the bonded portions or the defective leak can be prevented. Table 1 indicates the thermal expansion coefficient of each component constituting the semiconductor package. As described above, it is necessary to use the Cu/Mo/Cu clad material of the thickness ratio from 1:3:1 to 1:5:1 so as to prevent the inadequate leak of the glass 13, and therefore the thermal expansion coefficient should be in the range of $6.0-6.8(\times 10^{-6}/°C.)$.

TABLE 1

| Each component of package | Material | Coefficient of thermal expansion ($\times 10^{-6}/°C.$) |
|---|---|---|
| Window frame | Fe-45Ni | 6.2 |
| Lead Frame | | |
| Glass | LS-3001 | 7.1 |
| Cap | Fe-45Ni (NS-5) | 6.3–7.4 |
| Base plate | CMC 1:1:1 | 9.7 |
| | 1:3:1 | 6.8 |
| | 1:5:1 | 6.0 |
| | 1:8:1 | 5.5 |

Since the thermal expansion coefficient of the cap 16 is within $6.3-7.4(°C.10^{-6}/°C.)$, that of the window frame 15 and leadframe 12 is $6.2(\times 10^{-6}/°C.)$ and that of the glass 13 is $7.1(\times 10^{-6}/°C.)$, by using the cap 16, window frame 15, leadframe 12 and glass 13 of the greatest common thermal expansion coefficients $6.0-7.5(\times 10^{-6}/°C.)$, the glass 13 generates no leak and moreover, the bonding portions are kept in the favorable state. An adhesive with fillers such as silica glass of low thermal expansion coefficient mixed therein may be used in place of the glass 13.

FIG. 9 indicates a second embodiment of this invention, where FIG. 9(a) is a side sectional view of a main part and FIG. 9b) is a plan view of the lead portion.

As for the package in these drawings, the standing wave ratio (VSWR) is measured using the glass 13 of 11.8 dielectric constant ($\epsilon r$) (catalog value), while changing the thickness of glass (B) between the base plate 11 and window frame 15, and the width (W) and thickness (T) of the leadframe.

More specifically, an alumina ceramic micro-strip wire 17 ceramics having characteristic impedance of 50Ω is bonded to the package of FIG. 9 by soldering and electrically connected by wire bonding (by Al wire of $\phi\mu$m), and thereafter VSWR is measured by a network analyzer. In the measurement, VSWR ($S_{11}$) to detect the reflecting characteristic among the RF characteristics is measured. The result is shown in Table 2.

TABLE 2

| Window frame | Reflecting characteristic (VSWR (S$_{11}$) in 1GHz) | | | |
| --- | --- | --- | --- | --- |
| | Lead width (W)mm | Lead thickness (T)mm | Glass thickness (B)mm | VSWR (S$_{11}$) |
| Alumina | 0.33 | 0.15 | 0.59 | 1.44 |
| 0.5 mm | 0.33 | 0.08 | 0.58 | 1.35 |
| | 0.15 | 0.08 | 0.58 | 1.2 |
| 45 alloy | 0.15 | 0.125 | 0.52 | 1.5 |
| 0.5 mm | 0.15 | 0.125 | 0.6 | 1.37 |

A standing wave ratio (VSWR) is obtained by dividing the maximum of the voltage amplitude of the standing waves, occurring when the impedance of a 50Ω coaxial cable does not match with that of a transmission line of the package, by the minimum, which is generally preferably not larger than 1.3 in a high frequency package.

As is clear from Table 2, when the window frame 15 is made of alumina ceramics, the VSWR becomes a practical value when the lead width (W) is approximately 0.33 mm.

When the window frame 15 is metallic, it is possible to obtain a practical VSWR by setting the thickness (B) of glass 13 between the base plate 11 and window frame 15 to be 0.6 mm and the lead width (W) to be 0.15 mm.

FIG. 10 shows the relationship of the glass thickness (B), dielectric constant (εr) and lead width (W) to obtain VSWR of 1.3 when the lead thickness (T) is 0.125 mm or smaller (0.1 mm in the instant embodiment). In FIG. 10, upper region defined by a curve obtained when varying the lead width (W) represents the region where the VSWR is not larger than 1.3. It is the condition to make the package practical that the VSWR is in this region. Moreover, the lead width (W) should be 0.2 mm or less to achieve a dielectric constant (εr) of 14 or lower of the glass or adhesive, and the glass thickness (B) should be 0.6 mm or larger to obtain the glass practical in manufacturing.

After the package is soldered and sealed by the cap 16, the exterior of the base plate 11, leadframe 12, window frame 15 and cap 16 is plated with Sn.

Because of the Sn plating on the exterior, an inexpensive semiconductor device of high heat transfer and suitable for high frequency is obtained.

It is to be noted here that the thickness of the base plate, window frame or cap is not restricted to the values of the foregoing embodiments, but may be properly selected. Moreover, the plating for the exterior is not limited to Sn, but other plating may be used.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A semiconductor package comprising:

a base plate formed of a three layer Cu/Mo/Cu clad material, having a thickness ratio from 1:3:1 to 1:5:1, for attaching to a semiconductor chip, a leadframe for receiving at least one lead, said leadframe being bonded by an adhesive to said base plate, a window frame surrounding the semiconductor chip and bonded by said adhesive to said leadframe, and a cap bonded to said window frame, wherein said adhesive has the dielectric constant of not more than 14 and a thickness of not less than 0.6 mm.

* * * * *